United States Patent [19]

Ovens et al.

[11] Patent Number: 5,339,028

[45] Date of Patent: Aug. 16, 1994

[54] TEST CIRCUIT FOR SCREENING PARTS

[75] Inventors: Kevin M. Ovens, Garland; Jeffrey A. Niehaus, Dallas, both of Tex.

[73] Assignee: Texas Instruments Incorporated, Dallas, Tex.

[21] Appl. No.: 7,439

[22] Filed: Jan. 22, 1993

Related U.S. Application Data

[62] Division of Ser. No. 919,071, Jul. 23, 1992, Pat. No. 5,196,787.

[51] Int. Cl.$^5$ ............................................. G01R 31/28
[52] U.S. Cl. ............................ 324/158.1; 324/765; 324/767; 371/22.5
[58] Field of Search ............ 324/158 R, 158 F, 73.1, 324/158 T, 158 D; 371/22.5, 22.6

[56] References Cited

U.S. PATENT DOCUMENTS

| | | | |
|---|---|---|---|
| 3,423,677 | 1/1969 | Alford et al. | 324/158 F |
| 3,585,500 | 6/1971 | Grubel | 324/158 R |
| 4,871,963 | 10/1989 | Cozzi | 324/158 F |

*Primary Examiner*—Ernest F. Karlsen
*Attorney, Agent, or Firm*—Mark E. Courtney; Richard L. Donaldson; Wade James Brady

[57] ABSTRACT

A test circuit (10) is connected to a package pin of an integrated circuit via the first node (16). By setting the voltage on the package pin to a sufficient voltage, the test circuit becomes operable to measure DC characteristics of devices in the test circuit. The DC characteristics of the test circuit devices, such as resistors (26 and 34), diodes (44) and transistors (30 and 32) are used to estimate the AC characteristics of the actual integrated circuit. The AC characteristic estimations may be used to screen parts into various speed classes.

10 Claims, 2 Drawing Sheets

5,339,028

TEST CIRCUIT FOR SCREENING PARTS

This is a division of application Ser. No. 07/919,071, filed Jul. 23, 1992, now U.S. Pat. No. 5,196,787.

TECHNICAL FIELD OF THE INVENTION

This invention relates in general to integrated circuits, and more particularly to a test circuit for screening parts.

BACKGROUND OF THE INVENTION

The production of integrated circuits typically includes two testing stages: DC testing and AC testing. The DC testing is typically performed after the fabrication of the circuits on a semiconductor wafer using a "bed of nails" probe. The measurements taken during DC testing typically include power supply current, output sink and source current, input and output logic high/low voltages, along with other such tests. DC testing can be performed quickly for each circuit on the wafer, therefore, it is relatively inexpensive.

After DC testing, the wafers are assembled into individual integrated circuits. Very often, assembly is performed at a remote location. After assembly, AC testing is performed on the packaged units. Importantly, the speed at which an integrated circuit may operate is determined. Because of processing variations, the speed of the chips may vary from wafer-to-wafer, and even between individual circuits on a single wafer.

In many cases, parts are "screened" to classify individual integrated circuits at various speeds. For example, a part may be produced in three versions: 16 MHz, 20 MHz and 25 MHz. It would be advantageous to predict the speed of an individual integrated circuit prior to assembly; however, an expensive AC test is required to perform such measurements. Because of the cost involved in performing AC testing after processing stage, screening is generally performed after assembly.

Therefore, a need has arisen in the industry to provide a method and apparatus for predicting AC delays after processing without the need for expensive test equipment.

SUMMARY OF THE INVENTION

In accordance with the present invention, a testing method and apparatus for performing the same is provided which substantially eliminates or prevents the disadvantages and problems associated with prior testing method.

In the present invention, DC characteristics of one or more components in the integrated circuit are measured. These DC characteristics are used to estimate AC characteristics indicative of the speed of the integrated circuit.

This aspect of the present invention provides several technical advantages over the prior art. The DC measurements may be performed after fabrication using inexpensive test equipment. Hence, integrated circuits may be sorted for speed at low cost, and before packaging of the individual integrated circuits.

In one aspect of the present invention, a test circuit is associated with each integrated circuit. The test circuit contains components whose characteristics should correspond to actual components used on the integrated circuit. By applying predetermined signals to a package pin which is coupled to the test circuit and to the power source, the test circuit may be enabled.

This aspect of the invention provides the technical advantage of providing test circuitry on each integrated circuit which may be enabled using external package pins. The package pins used for testing may also be used in the normal operation of the integrated circuit.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figure 1:
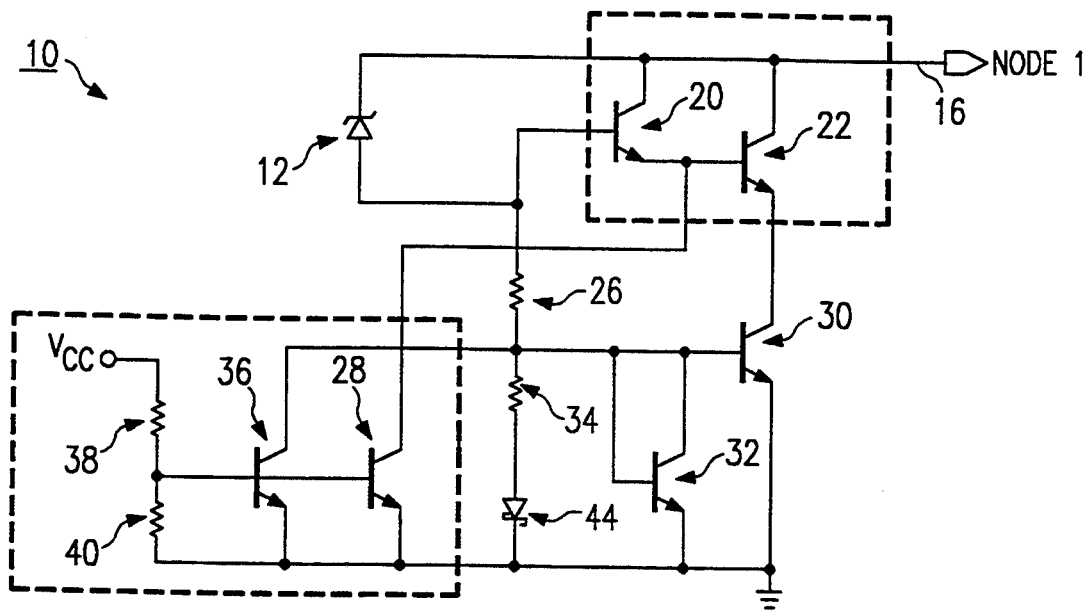
FIG. 1 illustrates a schematic representation of the test circuit of the present invention.
Figure 3:
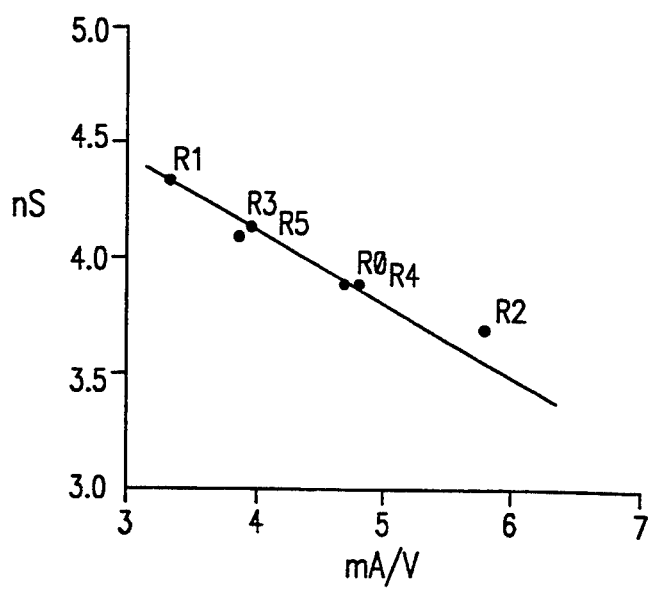
FIG. 3 illustrates a graphical representation of the correlation between the data provided by the test circuit in FIG. 1 and the actual propagation delay of the circuit.
Figure 2:
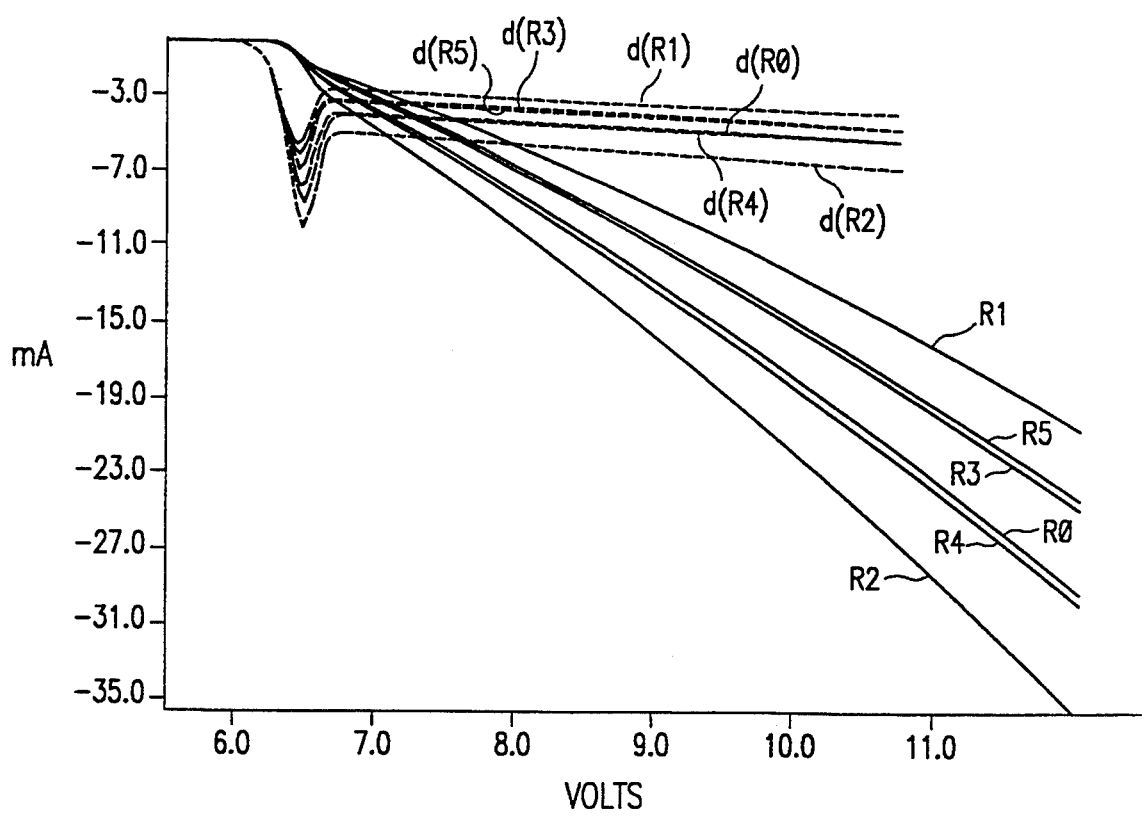
FIG. 2 illustrates a graphical representation of the data provided by the test circuit of FIG. 1 for a plurality of circuits having known characteristics.

The preferred embodiment of the present invention is best understood by referring to FIGS. 1–3 of the drawings, like numerals being used for like and corresponding parts of the various drawings.

FIG. 1 illustrates a schematic representation of the test circuit of the present invention. The test circuit 10 includes a Zener diode 12 connected between a first node 16 (hereinafter "NODE1") and the base of an NPN transistor 20. NODE1 is also connected to the collector of the NPN transistor 20 and the collector of an NPN transistor 22. The base of NPN transistor 20 is connected to the first end of a resistor 26. The base of NPN transistor 22 is connected to the emitter of transistor 20 and to the collector of an NPN transistor 28. The emitter of transistor 22 is connected to the collector of an NPN transistor 30. The base of NPN transistor 30 is connected to the collector of an NPN transistor 32, the base of transistor 32, the second end of resistor 26, the first end of a resistor 34 and the collector of an NPN transistor 36. The bases of transistors 28, and 36 are connected to the first ends of resistors 38 and 40. The second end of resistor 38 is connected to $V_{cc}$. The second end of resistor 34 is connected to the anode of diode 44. The second end of resistor 40, the emitters of transistor 28 and 36, the cathode of diode 44 and the emitters of transistors 30 and 32 are connected to ground.

The test circuit 10 is provided on each individual circuit fabricated on the wafer. The values for resistors 26 and 34 are chosen to be consistent with typically resistor values used on the integrated circuit. Transistors 30 and 32 are chosen such that their size ratio will proximate a minimum beta of the transistors. For example, for a minimum beta of 50, transistor 30 would be chosen to be 50 times the size of transistor 32.

In operation, NODE1 is connected to a pin on the integrated circuit. The test circuit 10 is enabled when $V_{cc}$ is taken to 0 volts (ground) and a voltage above the Zener breakdown voltage is applied to NODE1. Typically, the Zener diode 12 is designed such that it has a breakdown voltage of 5–6 volts. When the Zener diode breaks down, current may flow into transistors 30 and 32, resistors 26 and 34 and diode 44. By ramping the voltage at NODE1 and measuring the current through NODE1, it is possible to determine whether the betas of transistors 30 and 32 and the resistor values of resistors 26 and 34 are both high, both low, both nominal, or are any mixture of high, nominal or low parameters.

For example, to test for a minimum beta value of 50, transistor 30 is fabricated such that it has an area which is 50 times the area of transistor 32. If the betas of transistors 30 and 32 are greater than 50, almost all of the current through resistor R1 will conducted through transistor 32, resulting in a relatively low amount of current drawn into the base of transistor 30. Since the emitter currents of transistor 30 and 32 ratio directly with area, transistor 30 will draw more current because transistor 32 has more current. The amount of current drawn through transistor 30 will correspond directly to the current drawn through NODE1 via transistor 22. On the other hand, if the betas of transistors 30 and 32 are low, the current conducted through transistor 30 will decrease, resulting in a decreased current through NODE1.

Similarly, if the value of resistor 26 is high, less current will be supplied to the base of transistor 30 resulting in a lower current through NODE1. If the resistive value of resistor 26 is low, more current will be generated in the base of transistor 30, resulting in a high current through NODE1.

The Schottky diode forward bias voltage with respect to the base-emitter junction, forward bias voltage may be monitored by the test circuit 10. As the forward bias voltage of diode 44 increases, less voltage across resistor 34 is needed to drive the same current through transistors 30 and 32. Similarly, if the forward bias voltage across diode 44 is low, more voltage is necessary across resistor 34 to maintain the same current through transistors 30 and 32. The voltage across resistor 34 will be directly related to the current through NODE1.

Since the test circuits 10 are provided along with each individual circuit, resistors 26 and 34, diode 44 and transistors 30 and 32 are located very close to the devices used in the actual circuit. The variations between components on the test circuit 10 and the actual circuit will be very small because of their close proximity. Thus, if resistor 26 is 10 percent above the nominal value, then the resistors on the actual circuit will be 10 percent above nominal value as well. Similarly, if the transistors 30 and 32 are designed to have a beta of 50, but have an actual value of 60 in the test circuit 10, then it is very probable that the similarly designed transistors in the actual circuit will also have a beta which is 20 percent greater than nominal. The Schottky diode forward bias voltage will also correspond to the Schottky forward bias voltage of diodes on the actual circuit.

Generally, the primary factor in determining the speed of the circuit is the resistive values. The second most important factor is the beta of the transistors.

FIG. 2 illustrates I-V (current versus voltage) curves at NODE1 for five different circuits having test circuits 10 which known resistor and beta values. TABLE I sets forth the resistor and beta values for each circuit, along with the slope of the I-V curve at 9 volts and the actual propagation delay of the circuit.

TABLE I

| TEST CIRCUIT VALUES AND RESULTS | | | | |
|---|---|---|---|---|
| RUN | RESISTOR | BETA | d(Rx) @9 V | $T_{pHL}$ |
| R0 | NOM. | 100 | −4.91 mA/V | 3.86 ns |
| R1 | +20% | 50 | −3.40 mA/V | 4.33 ns |
| R2 | −20% | 100 | −6.04 mA/V | 3.65 ns |
| R3 | +20% | 100 | −4.03 mA/V | 4.10 ns |
| R4 | −20% | 50 | −4.98 mA/V | 3.86 ns |
| R5 | NOM. | 50 | −4.09 mA/V | 4.11 ns |

TABLE I-continued

FIG. 3 illustrates a plot of the propagation delays of the actual circuit as a function of the slope of the I-V curve at 9 volts.

As can be seen in FIG. 3, the propagation delay for each circuit correlates closely with the slope of the respective IV curve. For example, to screen four nanosecond parts, only those individual circuits having a slope of less than-4.4 mA/V would be chosen.

Thus, it is a technical advantage of the present invention that an approximate speed for a given circuit may be determined using DC measurements of specified components.

Referring again to FIG. 1, it should be noted that the test circuit 10 will not affect the normal operation of the actual circuit to which it is connected. Whereas NODE1 is connected to a package pin, the test circuit will operate only when NODE1 is raised to a voltage sufficient to breakdown the Zener diode 12 and when $V_{cc}$ is collapsed to ground, such that transistors 28 and 36 cutoff. The actual circuit, on the other hand, will not operate once $V_{cc}$ is connected to ground.

Transistors 20 and 22 are used to provide collector current for transistor 30 along with $BV_{ceo}$ breakdown protection for transistor 30.

While the present invention has been described in connection with a bipolar implementation, it should be noted that other technologies, such as MOS could be similarly employed.

Although the present invention has been described in detail, it should be understood that various changes, substitutions and alterations can be made herein without departing from the spirit and scope of the invention as defined by the appended claims.

What is claimed is:

1. A method of testing an integrated circuit comprising the steps of:
   providing model circuitry on the integrated circuit, said model circuitry having a plurality of transistors with a size ratio proportional to the minimum desired beta characteristic of the transistors on the integrated circuit, said transistors being coupled so that the current drawn by said transistors is proportional to said size ratio of said transistors;
   providing a test node coupled to a pin of said integrated circuit and to said model circuitry;
   measuring DC characteristics of said model circuitry by observing the current drawn by said transistors within said model circuitry in response to certain voltages being applied at said test node, said observations being made without enabling the other circuitry on the integrated circuit; and
   estimating the operating performance of the transistors within the integrated circuit from the observed current measurements of the model circuitry.

2. The method of claim 1 wherein said step of measuring DC characteristics comprises the steps of:
   applying a voltage ramp signal at said pin of said integrated circuit coupled to said test node; and
   measuring the ratio of current through said node to voltage at said node.

3. The method of claim 2 and further comprising the step of comparing the ratio of current to voltage to a predetermined ratio.

4. The method of claim 1 wherein said step of providing model circuitry further includes the step of providing a test circuit having a resistor, such that the current to voltage ratio at said node varies responsive to variations in the resistive value of said resistor relative to a predetermined nominal resistive value.

5. The method of claim 1 wherein said step of providing model circuitry further includes the step of providing a first transistor, such that the current to voltage ratio at said node varies responsive to variations in the gain of said transistor to a predetermined gain.

6. The method of claim 5 wherein said step of providing model circuitry further includes the step of providing a second transistor having a size ratio in comparison with said first transistor equal to a desired gain.

7. The method of claim 5 wherein said step of providing model circuitry further includes the step of providing a diode coupled such that the current drawn by the model circuitry varies responsive to the forward bias voltage of said diode.

8. The method of claim 5 wherein said step of observing the current drawn by said model circuitry comprises the step of applying a voltage to the test node and measuring the current through said test node.

9. The method of claim 8 wherein said step of applying a voltage comprises the step of applying a voltage to said package pin of the integrated circuit, said package pin connected to said test node.

10. The method of claim 1 wherein said step of providing model circuitry comprises the step of providing model circuitry which is enabled responsive to a signal provided on said test node.

* * * * *